United States Patent [19]

Orense

[11] Patent Number: 5,570,012
[45] Date of Patent: Oct. 29, 1996

[54] APPARATUS FOR TESTING A SEMICONDUCTOR DEVICE BY COMPARISON WITH AN IDENTICAL REFERENCE DEVICE

[75] Inventor: Lester R. Orense, Metro Manila, Philippines

[73] Assignee: Rohm Co. Ltd., Kyoto, Japan

[21] Appl. No.: 337,814

[22] Filed: Nov. 8, 1994

[51] Int. Cl.⁶ .................................................. G01R 15/12
[52] U.S. Cl. ........................................................ 324/158.1
[58] Field of Search ............................ 324/158.1, 133, 324/73.1, 765, 754, 760; 371/1, 15.1, 22.1, 25.1; 437/8; 257/40, 48

[56] References Cited

U.S. PATENT DOCUMENTS

| | | | |
|---|---|---|---|
| 4,055,801 | 10/1977 | Pike et al. | 371/25.1 |
| 4,092,589 | 5/1978 | Chau et al. | 371/25.1 |
| 4,150,331 | 4/1979 | Lacher | 324/133 |
| 4,651,088 | 3/1987 | Sawada | 371/22.1 |
| 4,720,671 | 1/1988 | Tada et al. | 324/765 |
| 4,774,456 | 9/1988 | Miller | 324/158.1 |

FOREIGN PATENT DOCUMENTS 57-189075  11/1982  Japan ..................... G01R 31/26

*Primary Examiner*—Vinh P. Nguyen
*Attorney, Agent, or Firm*—Michael D. Bednarek; Kilpatrick & Cody

[57] ABSTRACT

A semiconductor device under test (DUT) is checked, particularly for its wirebond integrity, by comparison with an identical reference device which is known good. Each of the DUT and reference device equally has pins. A current is selectively supplied to each pin of the reference device to provide a reference voltage drop at the reference device. Similarly, an identical current is selectively supplied to each pin of the DUT to measure a voltage drop at the DUT. The voltage drop at the DUT is compared with the reference voltage drop to provide a difference. Finally, determination is made as to whether the difference is within a tolerable range.

1 Claim, 3 Drawing Sheets

Semiconductor junction V/I characteristic

Semiconductor junction V/I characteristic

APPARATUS FOR TESTING A SEMICONDUCTOR DEVICE BY COMPARISON WITH AN IDENTICAL REFERENCE DEVICE

BACKGROUND OF THE INVENTION

1. Field of the Invention

This invention relates to an apparatus for testing semiconductor devices particularly with respect to wirebond integrity. The present invention also relates to a method of testing semiconductor devices.

2. Description of the Related Art

All semiconductor devices have at least one junction which exhibits such a voltage-to-current characteristic as shown in FIG. 4 of the accompanying drawings. The voltage drop for a typical semiconductor junction is in the region of 0.5–0.8 volts at about 1.0 mA at room temperature.

However, a semiconductor device cannot provide its intended function or characteristic if any of bondwires is improperly bonded. For instance, an open bondwire would result in an infinite voltage drop across it, and what can be measured is the compliance of the current source. Conversely, a short circuit occurring across two bondwires would result in a zero voltage drop.

Further, a semiconductor device may also suffer a resistive short across two bondwires. As shown in FIG. 5, the resistive short exhibits a linear voltage-to-current characteristic which is easily distinguishable from the characteristic of a good semiconductor junction.

In this way, since the state of the wirebonds greatly affects the property of a semiconductor device, it is critically necessary to test the semiconductor device for its wirebond integrity. A prior art tester for this purpose is disclosed in Japanese Patent Application No. 57-189075 (Laid-open; Nov. 20, 1982) for example.

According to the laid-open Japanese application identified above, a predetermined current is supplied through a selected pin (lead) of a semiconductor device under test (DUT) with the remaining pins held grounded. A resulting voltage drop across the selected pin is then compared with a reference voltage drop which is generated by a reference voltage generator, and the difference between the two voltage drops is used for determining whether the wirebond associated with the selected pin is good or not. Apparently, a similar operation is repeated with respect to every pin of the DUT to determine whether the semiconductor device as a whole is acceptable.

However, the prior art tester discussed above has been found to suffer a major drawback that the reference voltage generator need be re-programmed to generate a suitable reference voltage every time a differently designed semiconductor device is to be tested. Further, it is also necessary to newly set tolerable limits for the different semiconductor device.

SUMMARY OF THE INVENTION

It is, therefore, an object of the present invention to provide a semiconductor device testing apparatus which can obviate the need for writing-up a new program every time a new type of semiconductor device need be tested.

Another object of the present invention to provide a semiconductor device testing method which provides the same solution as the apparatus.

According to one aspect of the present invention, there is provided an apparatus for testing a semiconductor device (hereafter referred to as "DUT") by comparison with an identical reference device, each of the DUT and reference device equally having pins, the apparatus comprising: current supply means for selectively supplying a current to each pin of the reference device to provide a reference voltage drop across said each pin of the reference device and for selectively supplying an identical current to each pin of the DUT to measure a voltage drop across said each pin of the DUT; comparison means for comparing the voltage drop across said each pin of the DUT with the reference voltage drop to provide a difference; and determination means for determining whether said difference is within a tolerable range.

In a preferred embodiment, the current supply means may comprise a first current source selectively connected to said each pin of the DUT through a first multiplexer, and a second current source selectively connected to said each pin of the reference device through a second multiplexer. The comparison means may comprise a differential amplifier which simultaneously receives the voltage drop across said each pin of the DUT and the reference voltage drop for comparison. Further, the determination means may comprise first and second comparators for receiving said difference from the differential amplifier, and a limits generator for receiving the reference voltage drop to generate a first limit value for feeding to the first comparator and a second limit value for feeding to the second comparator.

In another preferred embodiment, the current supply means may comprise a single current source which is interchangeably connected to the DUT and reference device through a single mulitplexer. Further, the comparison means and determination means may be provided by a computer which receives the voltage drop across said each pin of the DUT and the reference voltage upon digitalization by an anlog-to-digital converter.

According to another aspect of the present invention, there is provided a method for testing a semiconductor device (hereafter referred to as "DUT") by comparison with an identical reference device, each of the DUT and reference device equally having pins, the method comprising the steps of: selectively supplying a current to each pin of the reference device to provide a reference voltage drop across said each pin of the reference device; selectively supplying an identical current to each pin of the DUT to measure a voltage drop across said each pin of the DUT; comparing the voltage drop across said each pin of the DUT with the reference voltage drop to provide a difference; and determining whether said difference is within a tolerable range.

The current supply to said each pin of the DUT and the current supply to said each pin of the reference device may be performed simultaneously independently of each other.

Alternatively, the current supply to said each pin to the DUT may be performed prior to the current supply to said each pin of the reference device. In this case, the comparing step and the determining step may be performed by a computer.

Other objects, features and advantages of the present invention will be fully understood from the following detailed description given with reference to the accompanying drawings.

DETAILED DESCRIPTION OF THE PREFERRED EMBODIMENTS

Figure 3:
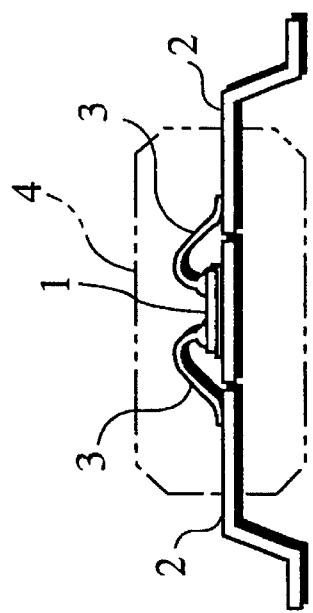
FIG. 3 is a front view showing a typical example of semiconductor device to which the present invention may be applied.
Figure 4:
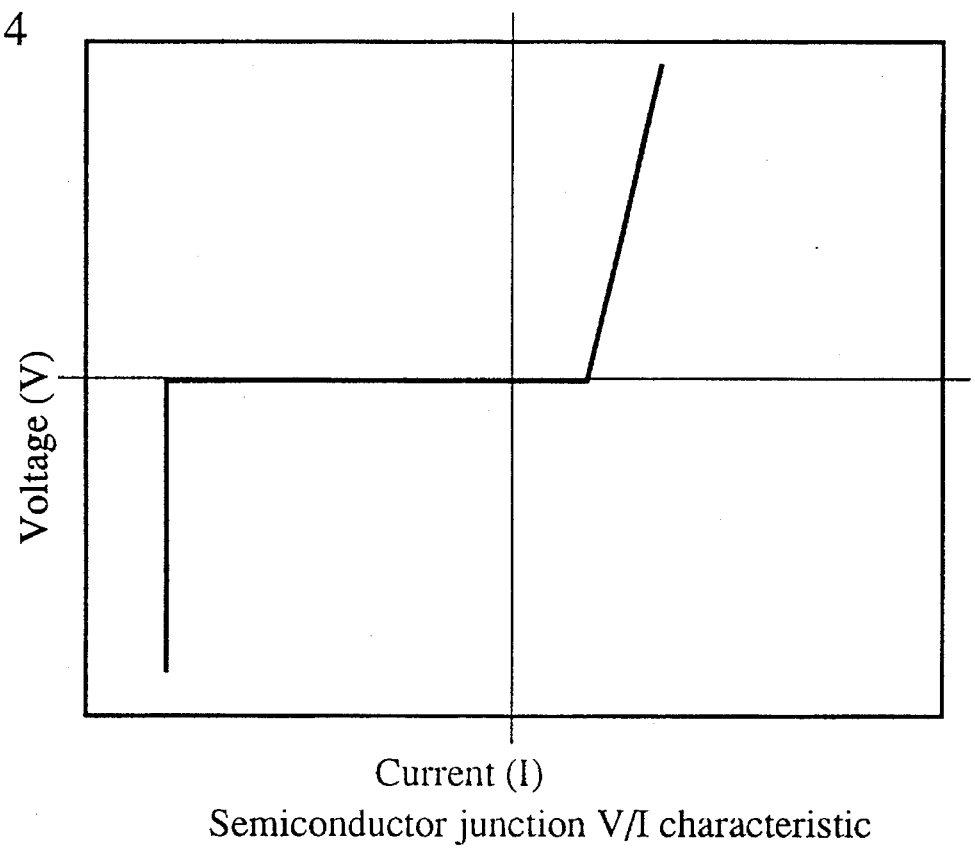
FIG. 4 is a graph showing the voltage-to-current (V/I) characteristic of a semiconductor junction.
Figure 5:
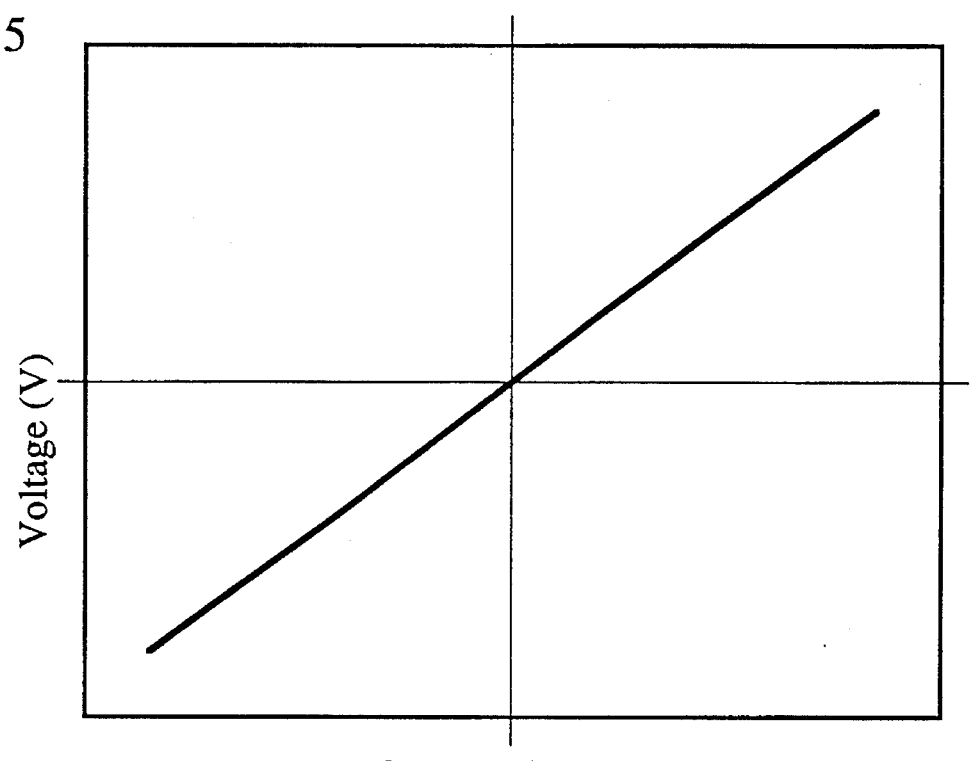
FIG. 5 is a graph showing the voltage-to-current (V/I) characteristic of a resistive short.

Referring first to FIG. 3 of the accompanying drawings, there is shown a typical example of semiconductor device which is tested for its wirebond integrity or characteristic by using an apparatus and method according to the present invention.

As shown in FIG. 3, the semiconductor device, which may be an IC, comprises a semiconductor chip 1 which is electrically connected to a plurality of leads or pins 2 (only two of several or many leads shown) through respective bondwires 3. The semiconductor chip 1 together with the bondwires 3 and part of the leads 2 may be enclosed in a resin package 4.

If any one of the bondwires 3 is improperly bonded to the semiconductor chip 1 and/or to a corresponding one of the leads 2, the electronic device fails to provide its intended function or chracteristic. For this reason, the semiconductor device need be tested for its wirebond integrity or characteristic. According to the present invention, the semiconductor device is checked by comparison with a reference semiconductor device which has the same structure as the device under test (DUT) and which is known "GOOD".

FIG. 9 shows the general arrangement of a semiconductor device testing apparatus according to a first embodiment of the present invention.

Figure 1:
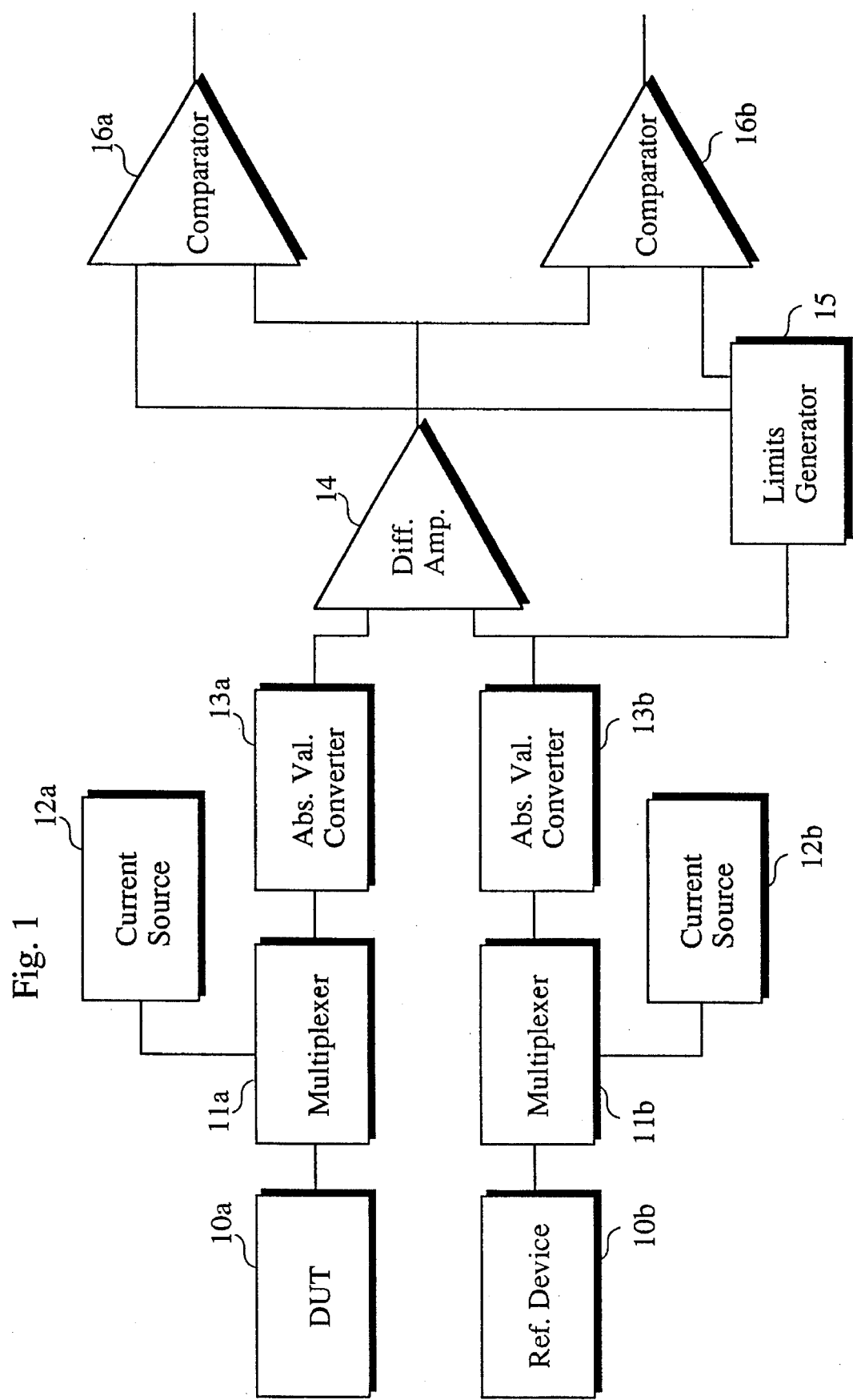
FIG. 1 is a block diagram showing an apparatus and method for testing a semiconductor device according to an embodiment of the present invention.

As shown in FIG. 1, a device under test (DUT) 10a is connected to a first multiplexer 11a which is in turn connected to a first current source 12a, whereas a reference device 10b is connected to a second multiplexer 11b which is in turn connected to a second current source 12b. Each of the DUT 10a and reference device lob may be fitted in a socket or placed on a suitable tester support.

The first multiplexer 11a switches a selected pin (see element 2 in FIG. 3) of the DUT 10a to the first current source 12a while grounding the remaining pins of the DUT 10a. Similarly, the second multiplexer 11b switches a selected pin of the reference device 10b (corresponding to the selected pin of the DUT 10a) to the second current source 12b while grounding the remaining pins of the reference device 10b.

The first and second current sources 12a, 12b simultaneously force an identical but independent current to the DUT 10a and reference device 10b, respectively, through the respective multiplexers 11a, 11b. This results in a voltage drop at each of the DUT 10a and reference device 10b across the selected pin and the remaining pins which are at ground potential.

The first multiplexer 11a is connected to a first absolute value converter 13a, whereas the second multiplexer 11b is connected to a second absolute value converter 13b. The readings of the voltage drops from the respective absolute value converters 13a, 13b are supplied to a differential amplifier 14 for comparison. The differential amplifier 14 puts out a single-ended voltage equal to the difference between the two voltage drops. The output voltage from the differential amplifier 14 should be zero in the ideal case, but this seldom happens because of manufacturing variations.

On the other hand, the reading of the voltage drop from the second absolute value converter 13b is also supplied to a limits generator 15 which generates tolerable limits as percentage of the voltage drop (reference voltage drop) across each selected pin the reference device 10b. For example, ±10% may be used as acceptable variations or deviations from the reference voltage drop.

The output voltage from the differential amplifier 14 may be either positive or negative depending on whether the voltage drop at the DUT 10a is larger or smaller than that at the reference device 10b. For this reason, the limits generator 15 is made to supply a positive limit value (e.g. +10% of the reference voltage drop) to a first comparator 16a for comparison with a positive output voltage from the differential amplifier 14, and a negative limit value (e.g. −10% of the reference voltage drop) to a second comparator 16bfor comparison with a negative output voltage from the differential amplifier 14.

Using the above-described apparatus, the voltage drop across every selected pin of the DUT 10a is compared with the reference voltage drop across every corresponding pin of the reference device 10b. Any pin of the DUT 10a having a voltage drop greater than the reference voltage drop by more than e.g. 10% is considered as suffering an "OPEN" failure. Conversely, any pin of the DUT 10b having a voltage drop less than the reference voltage drop by more than e.g. 10% is considered to suffer a "SHORT" failure. If all the pins of the DUT 10a exhibit voltage drops falling within the ±10% tolerable limits from the reference voltage drop, the DUT is considered "GOOD".

According to the embodiment described above, it is only necessary to prepare one reference device for performing wirebond integrity testing with respect to any type of DUT's. Thus, there is no need to write-up a new test program every time a new device is tested, thereby obviating the required engineering and programming time associated with it.

Figure 2:
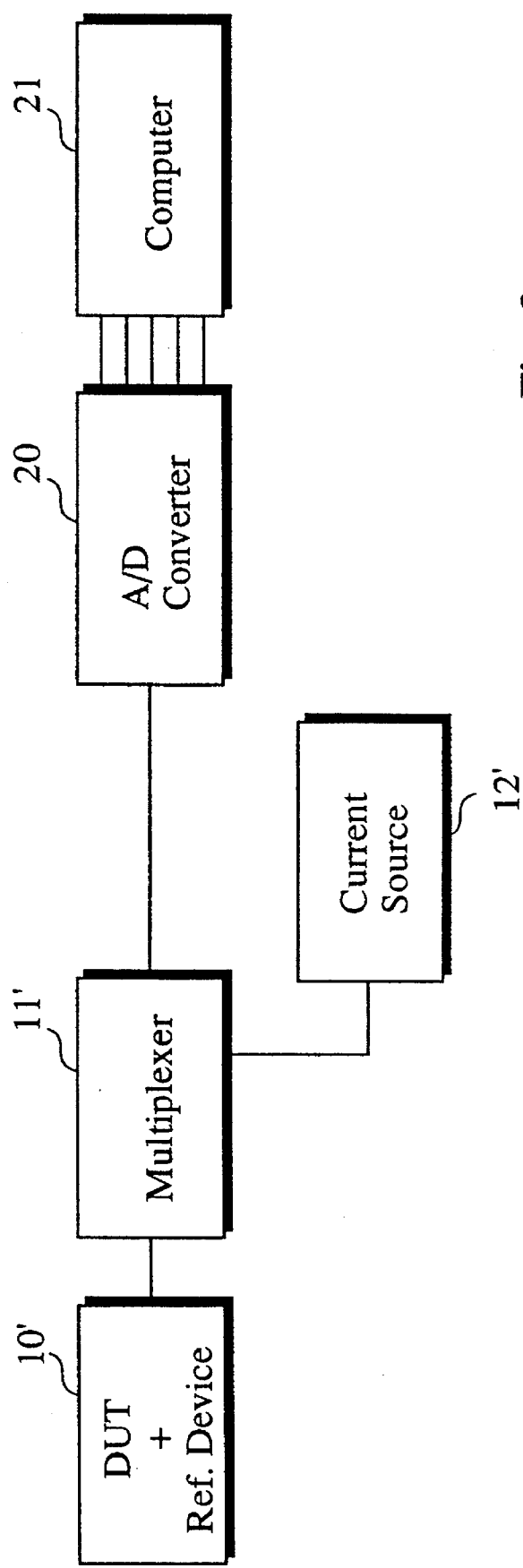
FIG. 2 is a block diagram showing an apparatus and method for testing a semiconductor device according to another embodiment of the present invention.

FIG. 2 shows the general arrangement of a semiconductor device testing apparatus according to a second embodiment of the present invention. The second embodiment is applicable where computer control is available or desired.

As shown in FIG. 2, the apparatus of the second embodiment comprises a single socket 10' to which is interchangeably plugged a DUT and a reference device. The socket 10' is connected to a multiplexer 11' which is in turn connected to a current source 12' and an analog-to-digital converter (ADC) 20. The apparatus also comprises a computer 21 connected to the ADC 20.

In operation for wirebond integrity testing, the reference device is first plugged in the socket 10', and a reference voltage drop is measured successively across every pin of the reference device by causing the current source 12' to supply a current through the multiplexer 11'. The output from the multiplexer 11' is digitalized at the ADC 20 for feeding to the computer 21 where the digitalized voltage drop at each pin of the reference device is stored in its memory. The computer further calculates tolerable limits on the basis of the reference voltage drop for storing in the memory.

Once the above preparatory step is finished, the reference device is removed from the socket 10' and replaced by the DUT. In this condition, the voltage drop across each pin of the DUT is measured and compared against the reference voltage drop stored in the computer 21 to determine whether a difference from the reference voltage drop falls within the tolerable limits. As a result, an evaluation can thus be made if the DUT is a "GOOD" device or not.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. An apparatus for testing a semiconductor device (hereafter referred to as "DUT") by comparison with an identical reference device, each of the DUT and reference device equally having pins, the apparatus comprising:

a first current source connected to a first multiplexer for selectively supplying a current to each pin of the DUT to provide a voltage drop across said each pin of the DUT;

a second current source connected to a second multiplexer for selectively supplying an identical current to each pin of the reference device to provide a reference voltage drop across said each pin of the reference device;

a differential amplifier connected to the first and second multiplexers for comparing the voltage drop across each said pin of the DUT with the reference voltage drop to provide a difference;

first and second comparators for receiving said difference form the differential amplifier; and a limits generator for receiving the reference voltage drop to generate a first limit value which is fed to the first comparator for comparison with said difference, the limits generator also generating a second limit value which is fed to the second comparator for comparison with said difference.

* * * * *